United States Patent [19]
Maixner et al.

[11] Patent Number: 5,298,333
[45] Date of Patent: Mar. 29, 1994

[54] CONDUCTIVE SURFACE LAYER

[75] Inventors: Uwe Maixner, Barum; Dieter Milferstädt, Tespe, both of Fed. Rep. of Germany

[73] Assignee: GKSS-Forschungszentrum Geesthacht GmbH, Geesthacht, Fed. Rep. of Germany

[21] Appl. No.: 688,380

[22] Filed: Apr. 19, 1991

Related U.S. Application Data

[63] Continuation of Ser. No. 403,750, Sep. 6, 1989, abandoned.

[30] Foreign Application Priority Data

Sep. 6, 1988 [DE] Fed. Rep. of Germany ....... 3830174

[51] Int. Cl.$^5$ .............................................. H01L 41/08
[52] U.S. Cl. ..................... 428/472; 428/469; 428/697; 428/698; 428/704
[58] Field of Search ............... 428/469, 408, 698, 697, 428/472, 704

[56]           References Cited
U.S. PATENT DOCUMENTS

| | | | |
|---|---|---|---|
| 4,426,423 | 1/1984 | Intrater et al. | 428/469 |
| 4,528,121 | 7/1985 | Matsushita et al. | 252/520 |
| 4,535,000 | 8/1985 | Gordon | 427/160 |
| 4,546,050 | 10/1985 | Amberger et al. | 428/630 |
| 4,795,723 | 1/1989 | Nishikawa et al. | 252/520 |
| 4,808,462 | 2/1989 | Yaba et al. | 428/432 |
| 4,888,246 | 12/1989 | Kuwata et al. | 428/432 |
| 4,900,972 | 2/1990 | Wersing et al. | 310/364 |

FOREIGN PATENT DOCUMENTS

| | | | |
|---|---|---|---|
| 3509039 | 9/1986 | Fed. Rep. of Germany | 428/627 |
| 81670 | 7/1981 | Japan | 428/627 |
| 230397 | 10/1986 | Japan | 428/627 |

OTHER PUBLICATIONS

Thin Solid Films, 127 (1985) pp. 205-214, Francois et al "Reflectivity of ScN$_x$ Thin Films: Comparison with TiN$_x$, TiN$_x$C$_y$ and ZrN$_x$ Coatings and Applications to the Photothermal Conversion of Solar Energy".

*Primary Examiner*—A. A. Turner
*Attorney, Agent, or Firm*—Robert W. Becker & Associates

[57]           ABSTRACT

A conductive surface layer, for example to form an electrode. For piezoelectric, pyroelectric, and ferroelectric components, as well as for piezoceramic components, the layer is formed of at least one electrically conductive hard product of at least one of the metals of at least the groups III to VIII of the periodic table of the elements.

11 Claims, 1 Drawing Sheet

CONDUCTIVE SURFACE LAYER

This application is a continuation of application Ser. No. 403,750 filed Sep. 6, 1989, now abandoned.

BACKGROUND OF THE INVENTION

The present invention relates to a conductive surface layer, for example to form an electrode.

Piezoelectric elements, for example oscillator crystals, are generally provided with two film or sheet-like, oppositely disposed electrodes that are essentially parallel to one another; up to now these electrodes have, for example, been made of such precious metals as gold, chromium, silver, or also from tungsten or the combination of various other metals. Furthermore, the electrodes can each also be formed from the aforementioned metallic materials in the form of individual superimposed layers. During the course of forming the film or sheet-like electrodes, in other words during the manufacture, for example by vapor deposition, it can happen that the thereby occurring thermal stress is so great that the respective curie temperature of the piezoelectric element is partially reached or exceeded, as a result of which a depolarization of the piezoelectric component can occur. Unfortunately, when the curie temperature is reached and exceeded, the piezoelectric component looses its specific piezoelectric properties, at least in part. The general rule is that the half curie temperature should not be exceeded.

A further drawback or problem encountered during the manufacture of piezoelectric components was that the generally metallic electrodes often exhibited an inadequate adhesive and wear strength over the entire surface or over portions thereof, and also exhibited an electrical conductivity of the electrode surfaces that varied over the course of time that up to now also varied over the entire electrode surface or portions thereof and varied with time. A further drawback of the heretofore known electrode formation on piezoelectric components consists in the relatively great mechanical damping of the oscillation characteristics of the component due to the thick metallizing (up to $2 \times 10^{-2}$ mm for silver) and the inertia of the metal electrodes connected therewith.

A further drawback that occurs when stacking several piezoelectric components is the gap deflection that occurs with thick metal electrodes.

It is therefore an object of the present invention to provide a conductive surface layer that avoids the aforementioned drawbacks, that is more economical to produce than was the case with heretofore known layers, so that, for example an improvement of the oscillation characteristics of an oscillator crystal are achieved and better resonant or oscillator circuit qualities can be achieved, and with which the aging rate is reduced in comparison to the heretofore known components.

BRIEF DESCRIPTION OF THE DRAWING

This object, and other objects and advantages of the present invention, will appear more clearly from the following specification in conjunction with the accompanying schematic drawing, in which.

SUMMARY OF THE INVENTION

Figure 1:
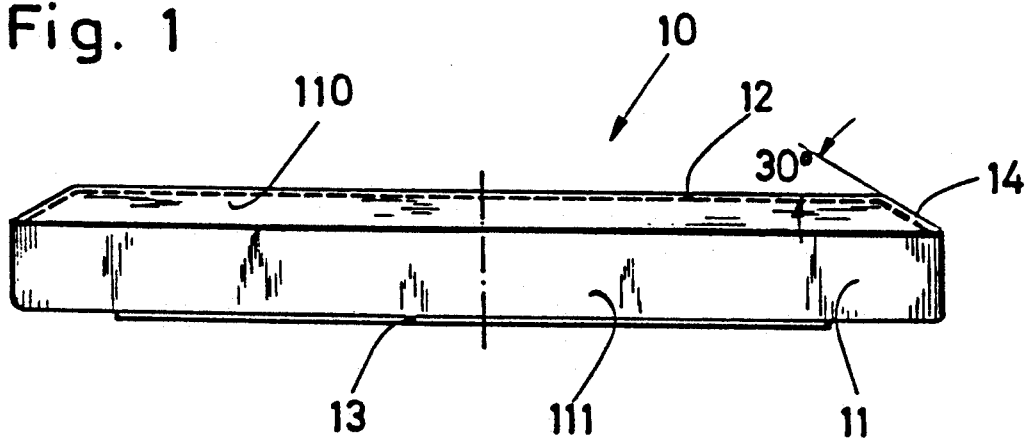
FIG. 1 is a side view of a piezoelectric element that is in the form of an oscillator crystal and has two essentially sheet-like, oppositely disposed electrodes.

The present invention is characterized primarily by a layer, for piezoelectric, pyroelectric, and ferroelectric components, as well as for piezoceramic components, that is formed of at least one electrically conductive hard product of at least one of the metals of at least the groups III to VIII of the periodic table of the elements.

The advantage of the inventively embodied piezoelectric component consists essentially in that the theoretically possible properties of the piezoelectric element were actually nearly reached, and in particular relative to a reduction of the depolarization of the element as such, as well as to the preclusion, to a large extent, of the mechanical damping of the component due to the inertia of the heretofore known metallic electrodes. Furthermore, the manufacture of the inventive piezoelectric component in accordance with the present invention can be carried out in a considerably more economical manner than was possible to form the sheet-like electrodes of heretofore known components.

With the present invention, it is possible to build up conductive surface layers as electrodes or electrode layers having a strong, homogeneous coating of the surfaces of the component, so that it is possible to have a complete, full-surface and undisturbed shunting or supply of charges. Pursuant to the present invention, despite very frequent mechanical movements (oscillations) of the component at the phase boundary between the component and the surface layer (electrode) or the surface layers (electrode layers), the strong, homogeneous coating remains intact, even after long periods of operation. This also prevents locally high charges from damaging, for example, an oscillator crystal, or also damaging the surface layers (electrode layers), for example by oxidation. Only when the surface layers (electrodes) oscillate in resonance over the entire surface, even in the micro range, and the adhesion at that location is not broken, is it possible to prevent locally high charges from damaging the crystal, or to prevent the metallic electrodes from being altered and damaged during the local discharging process, for example due to oxidation.

Localized discharges of this type cause, in the micro range, not only phenomena that are comparable to fritting, but rather with the locally pronounced temperature gradients that are connected therewith, also the thermal stresses between metal layers, for example with the combination quartz-chromium (as adhesive) -gold, cannot be disregarded (increased noise signal).

Pursuant to one preferred specific embodiment of the present invention, the hard products are advantageously formed by nitrides, carbides, silicides, or borides. However, in principle any other suitable hard product or hard product mixtures could also be used. It is also possible to form the electrodes of the present invention from individual layers that have different hard products of the aforementioned metals of the groups III to VIII of the periodic table of the elements, whereby the individual layers could also comprise different metal bases of the hard products. The metals that form the bases of the hard products preferably include at least titanium, zirconium, chromium, tantalum, molybdenum, vanadium, hafnium, niobium, tungsten, nickel, or iron. In addition, the hard products can be titanium nitride, zirconium nitride, chromium nitride, titanium carbide, zirconium carbide, tantalum carbide, titanium disilicide, zirconium disilicide, molybdenum silicide, titanium boride, chromium boride, and zirconium boride.

In principle, it is advantageously also possible to use hard product mixtures as the hard products, whereby the hard product mixtures preferably include at least titanium carbonitride, zirconium carbonitride, titanium boronitride, titanium zirconium nitride, and titanium zirconium carbonitride.

It is also advantageous that the metals be mixtures of the metals of at least the groups III to VIII of the periodic table of the elements. Here too electrodes of layer-like construction can be formed, whereby on the one hand different hard products of the metals can form the individual layers, or different metal alloys can be used as the metal bases. The metals include at least titanium zirconium, vanadium, tantalum, hafnium, niobium tungsten, chromium, molybdenum, nickel, or iron.

Pursuant to one advantageous specific embodiment of the present invention, the hard products and/or hard product mixtures could also have a non-stoichiometric atomic and/or molecular structure, so-called inclusion complexes.

Also conceivable are any suitable combinations of individual layers that altogether respectively form a film or sheet-like electrode on the component body if a layer-like construction is selected.

Each hard product layer can be at least partially covered by a layer of at least one of the metals of at least the groups I to VIII of the periodic table of the elements, with the metal layer preferably being in such a form that it has at least partial solderable characteristics for the application of leads.

Further specific features of the present invention will be described in detail subsequently.

Description of Preferred Embodiments

Referring now to the drawing in detail, the piezoelectric component 10, which in the illustrated embodiment forms an oscillator crystal, comprises a quartz plate or slab 11 that has an essentially rectangular cross-sectional configuration. Disposed on two essentially parallel opposite sides 110, 111 of the quartz member 11 are respective electrodes 12, 13 that are formed of hard products of the metals of at least the groups III to VIII of the periodic table of the elements. In this connection, the hard products can advantageously be nitrides, carbides, silicides, or borides.

It is also conceivable that the metals, rather than being elementary metals, are mixtures of the metals of at least the groups III to VIII of the periodic table of the elements.

It should be noted that the piezoelectric component 10 in the form of an oscillator crystal that is illustrated in FIG. 1 could, of course, also have any other desired suitable cross-sectional configuration, and in particular as a function of the desired oscillation behavior as well as of the aimed-at piezoelectric properties of the component.

It has been shown that in particular in electroacoustic flow meters that operate in the ultrasonic range, oscillator crystals of the type illustrated in the drawing exhibit a very good oscillation behavior that very closely approaches the theoretically possible properties of piezoelectric components. For this purpose, as can be seen in the drawing, the edge regions 14 of the electrode 12, which has a larger surface area than does the electrode 13, are chamfered at an angle relative to the surface of the electrode 12. The edge region 14 is also at least partially covered by the electrode 12. By way of example, the chamfer of the edge region 14 can be disposed at an angle of 30° relative to the surface of the electrode 12. The ridge of the chamfer toward the surface of the electrode 12 can be slightly rounded-off, which is not shown in detail in the drawing. Furthermore, the edge between the extended surface of the lower electrode 13 and, in the drawing, the vertical face of the quartz member 11 can similarly be slightly rounded or chamfered.

Thanks to the present invention, an entirely new class of material is introduced as electrode material, for example for piezoelectric, pyroelectric, and ferroelectric as well as piezoceramic components. As a consequence of the inventive conductive surface layer, several previously incompatible properties are achieved. These include:

Adhesive strength:

The adhesive strength of, for example, an approximately $5 \times 10^{-4}$ mm thickness of TiN on quartz is considerably greater than the adhesive strength of gold-chromium on quartz, and in particular always over the entire surface of the electrode or layer. "Islands" having a lesser adhesion on the electrodes have not yet been observed with TiN, whereas such is frequently the case with gold-chromium-quartz coatings. The inventive layers can, for example, not be removed or even damaged with a wire brush or similar tool.

Protection against wear:

An approximately $5 \times 10^{-4}$ mm thick TiN layer has a protection against wear such as is known, for example, in conjunction with TiN-coated tools such as drill bits, milling tools, lathe tools, etc. This is of advantage for, for example, piezoelectric components if the conductive layers (electrodes) must be resistant to wear. (The very frequent variations in thickness of the components has an abrasive effect under certain circumstances.) It was observed that electrodes that were provided for oscillator crystals for ultrasonic generation, become loose at the contacts due to wear and hence can no longer be used. The inventive conductive surface layer in the form of a $5 \times 10^{-4}$ mm thick TiN electrode showed no wear even after a long period of use; rather, the only wear that could be observed was on the electrode counterpiece.

Electrical resistance:

It was observed that even after a long period of operation a merely $5 \times 10^{-4}$ mm thick TiN surface layer on the quartz was found to be of distinctly lower resistance than a conventional approximately $5 \times 10^{-3}$ mm thick gold layer having a chromium base. This is based on the fact that already during the metal coating, and also during the later use, the surface properties of metals can become of greater resistance due to deposition, coating, loading, and catalytic reactions. The resulting charges (charge carrier accumulations, parasitic super capacity) observed on the isolated "islands" and crystal spots basically reduce the characteristics of a resonant or oscillator circuit. In contrast, with the disclosure of the present invention, with the formation of the chemically in particular inert and low resistance TiN hard product layer, such phenomena were not observed.

Electrode mass:

Since, for example with oscillator crystals, a layer thickness of approximately $5 \times 10^{-4}$ mm has proven to be adequate by experience, the electrode weight relative to an approximately $5 \times 10^{-3}$ mm thick gold layer is reduced by a factor of 50. The lower electrode mass reduces the damping of the oscillator, which leads to an improvement in quality. An optimized coating with a hard product or material is additionally more economical relative to a coating of precious metals.

Gap deflection:

In contrast to the "thick elastic" metal electrodes, thin TiN electrodes of the present invention have an elasticity that is comparable to quartz and hence prevent the undesired gap deflection, for example with stacked piezo-components.

Figure 2:
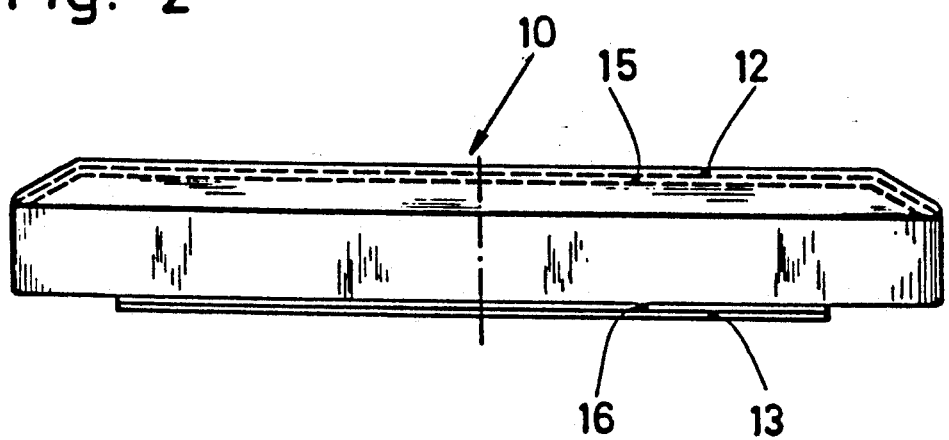
FIG. 2 illustrates an element similar to that of FIG. 1, yet with an additional metallic intermediate layer.

Pursuant to a modified embodiment of the present invention, as illustrated in FIG. 2, it is possible to dispose between each of the layers 12 and 13 and the member 11 of the component at least one intermediate electrode layer 15, 16 that is formed of at least one of the metals of at least the groups III to VIII of the periodic table of the elements.

Figure 3:
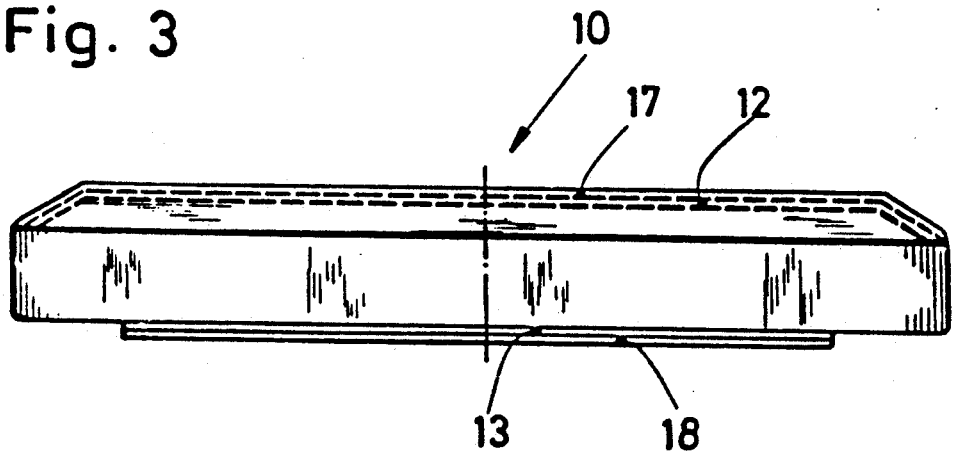
FIG. 3 illustrates an element similar to that of FIG. 1, however with an additional metallic cover layer on the hard product layer.

Pursuant to another modified embodiment of the present invention, as illustrated in FIG. 3, it is possible to at least partially cover each hard product layer 12, 13 with a top electrode layer 17, 18 that is formed of at least one of the metals of at least the groups I to VIII of the periodic table of the elements. These top electrode layers 17, 18 of metal can have solderable characteristics.

The present invention is, of course, in no way restricted to the specific disclosure of the specification and drawing, but also encompasses any modifications within the scope of the appended claims.

What we claim is:

1. A component comprising a substrate having properties selected from the group consisting of piezoelectric, pyroelectric, ferroelectric, and piezoceramic, and a homogeneous conductive surface layer comprising a hard product of at least one metal compound, wherein the metal in said metal compound is at least one of the metals in the Groups IIIA to VIIIA and IIIB to VIIIB of the Period Table of elements.

2. A component according to claim 1, wherein said hard product is at least one member selected from the group consisting of nitrides metal, carbides metal, silicides metal, and borides metal.

3. A component according to claim 2, wherein said hard product is at least one member selected from the group consisting of titanium nitride, zirconium nitride, chromium nitride, titanium carbide, zirconium carbide, tantalum carbide, titanium disilicide, zirconium disilicide, molybdenum silicide, titanium boride, chromium boride, and zirconium boride.

4. A component according to claim 2, wherein said metal is a least one member selected from the group consisting of titanium, zirconium, chromium, tantalum, molybdenum, vanadium, hafnium, niobium, tungsten, nickel, and iron.

5. A component according to claim 4, wherein said hard product is selected from the group consisting of titanium carbonitride, zirconium carbonitride, titanium boronitride.

6. A component according to claim 4, wherein said hard product is titanium zirconium nitride or titanium zirconium carbonitride.

7. A component according to claim 1, wherein said hard product is a non-stoichiometric metal compound.

8. A component according to claim 1, wherein between said conductive surface layer and said substrate there is disposed at least one intermediate layer of at least one of the metals in groups IIIA to VIIIA and IIIB to VIIIB of the periodic table of the elements.

9. A component according to claim 1, wherein said hard product is at least partially covered by a layer metal of at least one of the metals of the groups IA to VIIIA and IB to VIIIB of the periodic table of the elements.

10. A component according to claim 9, wherein said metal layer is solderable for the application of leads.

11. A component according to claim 1, wherein said substrate is quartz.